United States Patent
Won et al.

(10) Patent No.: US 9,112,092 B2
(45) Date of Patent: Aug. 18, 2015

(54) LIGHT EMITTING DEVICE AND LIGHT EMITTING DEVICE PACKAGE

(71) Applicant: LG INNOTEK CO., LTD., Seoul (KR)

(72) Inventors: Jong Hak Won, Seoul (KR); Heon Jin Seo, Seoul (KR); Kwang Sun Baek, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 13/838,282

(22) Filed: Mar. 15, 2013

(65) Prior Publication Data

US 2014/0034903 A1 Feb. 6, 2014

(30) Foreign Application Priority Data

Aug. 6, 2012 (KR) .................. 10-2012-0086009

(51) Int. Cl.
*H01L 29/06* (2006.01)
*H01L 33/14* (2010.01)
*H01L 33/06* (2010.01)

(52) U.S. Cl.
CPC ............... *H01L 33/14* (2013.01); *H01L 33/06* (2013.01)

(58) Field of Classification Search
CPC ...................................................... H01L 33/14
USPC ............................................................ 257/13
See application file for complete search history.

(56) References Cited

U.S. PATENT DOCUMENTS

| 8,471,243 | B1 * | 6/2013 | Arena ............................. 257/13 |
| 2003/0197188 | A1 * | 10/2003 | Watatani et al. ................ 257/88 |
| 2008/0093593 | A1 * | 4/2008 | Ryu ................................ 257/13 |
| 2011/0133630 | A1 * | 6/2011 | Song et al. ..................... 313/498 |
| 2011/0187294 | A1 * | 8/2011 | Bergmann et al. ............ 315/363 |
| 2013/0292637 | A1 * | 11/2013 | Senes et al. .................... 257/13 |

* cited by examiner

*Primary Examiner* — Jarrett Stark
*Assistant Examiner* — Mohammad M Hoque
(74) *Attorney, Agent, or Firm* — Ked & Associates, LLP

(57) ABSTRACT

Disclosed is a light emitting device and a light emitting device package. The light emitting device includes a substrate; a first conductive semiconductor layer on the substrate; an active layer on the first conductive semiconductor layer; and a second conductive semiconductor layer on the active layer, wherein the active layer includes: a plurality of barrier layers; and a plurality of well layers between the barrier layers, and wherein at least two of the barrier layers have different energy bandgaps and have different thicknesses.

20 Claims, 7 Drawing Sheets

LIGHT EMITTING DEVICE AND LIGHT EMITTING DEVICE PACKAGE

The present application claims priority under 35 U.S.C. §119(a) of Korean Patent Application No. 10-2012-0086009 filed on Aug. 6, 2012, which is hereby incorporated by reference in its entirety.

BACKGROUND

The embodiment relates to a light emitting device.

The embodiment relates to a light emitting device package.

An LED (Light Emitting Device) is a device to convert electrical energy into light energy. The LED may represent various colors by adjusting the composite ratio of compound semiconductors.

When comparing with conventional light sources such as a fluorescent lamp, and an incandescent lamp, the semiconductor light emitting device has advantages such as low power consumption, a semi-permanent life span, a rapid response speed, safety, and an eco-friendly property. The application of the semiconductor light emitting device is expanded to a light emitting diode backlight serving as a substitute for a CCFL (Cold Cathode Fluorescence Lamp) constituting a backlight of an LCD (Liquid Crystal Display), a white light emitting diode lighting device serving as a substitute for the fluorescent lamp or the incandescent lamp, a vehicle headlight, and a signal lamp.

SUMMARY

The embodiment provides a light emitting device capable of expanding an orientation angle and a light emitting device package.

The embodiment provides a light emitting device capable of increasing light power and a light emitting device package.

According to the embodiment, there is provided light emitting device including: a substrate; a first conductive semiconductor layer on the substrate; an active layer on the first conductive semiconductor layer; and a second conductive semiconductor layer on the active layer, wherein the active layer includes: a plurality of barrier layers; and a plurality of well layers between the barrier layers, and wherein at least two of the barrier layers have different energy bandgaps and different thicknesses.

According to the embodiment, there is provided light emitting device including: a substrate; a first conductive semiconductor layer on the substrate; an active layer on the first conductor semiconductor layer; and a second conductive semiconductor layer on the active layer, wherein the active layer includes: a plurality of barrier layers; and a plurality of well layers between the barrier layers, and wherein a lowermost layer of the barrier layers is disposed adjacent to the first conductive semiconductor layer, an uppermost layer of the barrier layers is disposed adjacent to the second conductive semiconductor layer, an energy bandgap of the lowermost layer is greater than an energy bandgap of the uppermost layer, an a thickness of the lowermost layer is less than a thickness of the uppermost layer.

According to the embodiment, there is provided a light emitting device package including: a body; first and second lead frames on the body; and a light emitting device on the body or on at least one of the first and second lead frames, wherein the light emitting device includes: a substrate; a first conductive semiconductor layer on the substrate; an active layer on the first conductive semiconductor layer; and a second conductive semiconductor layer on the active layer, wherein the active layer comprises: a plurality of barrier layers; and a plurality of well layers between the barrier layers, and wherein at least two of the barriers have different energy bandgaps and different thicknesses.

DETAILED DESCRIPTION OF THE EMBODIMENTS

Figure 1:
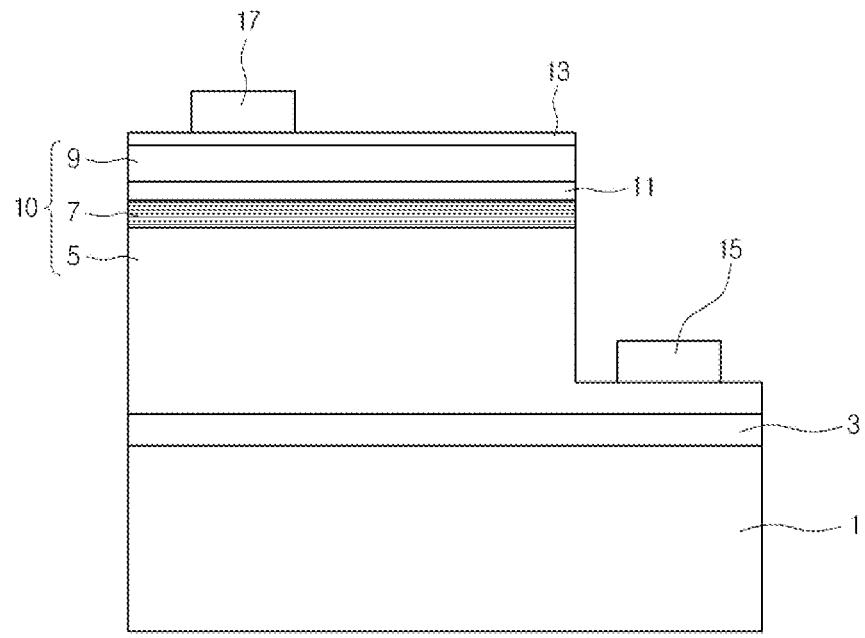
FIG. 1 is a sectional view illustrating a light emitting device according to the embodiment.

In the description of the embodiments, it will be understood that when a layer (film), an area, a pattern, or a structure is referred to as being "on" or "under" another layer (film), another area, another pad or another pattern, it can be "directly" or "indirectly" on the other layer (film), the other area, the other pattern may also be present. Such a position of the layer has been described with reference to the drawings.

Hereinafter, embodiments will be described in detail with reference to accompanying drawings. The thickness and size of each layer shown in the drawings may be exaggerated, omitted or schematically drawn for the purpose of convenience or clarity. In addition, the size of the elements does not utterly reflect an actual size.

FIG. 1 is a sectional view illustrating a light emitting device according to the embodiment.

Referring to FIG. 1, the light emitting device according to the embodiment may include a substrate 1, a buffer layer 3, a light emitting structure 10, and first and second electrodes 15 and 17.

A conductive layer 13 may be disposed between the light emitting structure 10 and the second electrode 17, but the embodiment is not limited thereto. The conductive layer 13 allows a current to spread and to easily flow to the light emitting structure 10.

For example, the light emitting structure 10 includes a first conductive semiconductor layer 5, an active layer 7, and a second conductive semiconductor layer 9, but the embodiment is not limited thereto.

For example, the first conductive semiconductor layer 5 may include a plurality of semiconductor layers having different composite ratios, material types, or doping densities.

The active layer 7 may include a plurality of semiconductor layers having different composite ratios, material types, or doping densities. The second conductive semiconductor layer 9 may include a plurality of semiconductor layers having different composite ratio, material types, or doping densities.

A third conductive semiconductor layer (not shown) may be disposed between the second conductive semiconductor 9 and the conductive layer 13, but the embodiment is not limited thereto. The third conductive semiconductor layer may include the same conductive dopant as that of the first conductive semiconductor layer 5 of the second conductive semiconductor layer 9.

For example, the substrate 1 serves as a member to grow the light emitting structure, but the embodiment is not limited thereto.

In order to stably grow the light emitting structure 10, the substrate 1 may include a material making a smaller lattice constant difference from that of the light emitting structure 10.

The substrate 1 may include at least one selected from the group consisting of Al2O3, SiC, Si, GaAs, GaN, ZnO, Si, GaP, InP and Ge.

The buffer layer 3 may be interposed between the substrate 1 and the light emitting structure 10. The buffer layer 3 may be formed to reduce the lattice constant difference between the substrate 1 and the light emitting structure 10.

The buffer layer 3 and the light emitting structure 10 may include a group II-VI semiconductor material or a group III-V compound semiconductor material.

For example, the light emitting structure 10 may include a first conductive semiconductor layer 5, an active layer 7, and a second conductive semiconductor layer 9, but the embodiment is not limited thereto.

For example, the first conductive semiconductor layer 5 may be formed on the substrate 1 or the buffer layer 3, the active layer 7 may be formed on the first conductive semiconductor layer 5, and the second conductive semiconductor layer 9 may be disposed on the active layer 7.

The buffer layer 3 and the first conductive semiconductor layer 5, and the active layer 5 and the second conductive semiconductor layer 9 may be sequentially grown on the substrate 1 using the same process equipment, for example, a Metal-Organic Chemical Vapor Deposition (MOCVD) scheme.

For instance, the first conductive semiconductor layer 5 may include an N type semiconductor layer including N type dopants. The first conductive semiconductor layer 5 may be formed of a semiconductor material having a composite formula of $In_xAl_yGa_{1-x-y}N$ ($0 \leq x \leq 1$, $0 \leq y \leq 1$, and $0 \leq x+y \leq 1$), e.g., at least one of InAlGaN, GaN, AlGaN, AlInN, InGaN, AlN, and InN, but the embodiment is not limited thereto. The N type dopants may include Si, Ge, Sn and/or Te.

The active layer 7 may be formed on the first conductive semiconductor layer 5. First carriers (e.g., electrons) injected through the first conductive semiconductor layer 5 are recombined with second carriers (e.g., holes) injected through the second conductive semiconductor layer 9 in the active layer 7 so that the active layer may emit light having a main wavelength band corresponding to the difference of an energy band determined depending on a formation material of the active layer 7.

The active layer 7 may include one of a multi quantum well (MQW) structure, a quantum dot structure, and a quantum wire structure. The active layer 7 may have the stack structure in which a cycle of well and barrier layers including group II-VI or III-V compound semiconductors are repeatedly formed.

For example, the active layer 7 may be formed of a semiconductor material having a composite formula of $In_xAl_yGa_{1-x-y}N$ ($0 \leq x \leq 1$, $0 \leq y \leq 1$, and $0 \leq x+y \leq 1$). The active layer 7 may be formed in the stack structure of InGaN/GaN, InGaN/AlGaN, InGaN/InGaN. The energy bandgap of the barrier layer may be greater than energy the bandgap of the well layer.

The second conductive semiconductor layer 9 may be formed on the active layer 7. For instance, the second conductive semiconductor layer 9 may include a P type semiconductor layer including P type dopants. The second conductive semiconductor layer 9 may be formed of a semiconductor material having a composite formula of $In_xAl_yGa_{1-x-y}N$ ($0 \leq x \leq 1$, $0 \leq y \leq 1$, and $0 \leq x+y \leq 1$). The second conductive semiconductor layer 9 may include at least one of InAlGaN, GaN, AlGaN, InGaN, AlN, InN and AlInN, but the embodiment is not limited thereto. The P type dopants may include Mg, Zn, Ca, Sir, and/or Ba.

The conductive layer 13 may be formed on the second conductive semiconductor layer 9, and a second electrode 17 may be disposed on the conductive layer 13.

The second electrode 17 may include a transparent metallic material. Accordingly, since the second electrode 17 blocks the output of light, the second electrode 17 may be locally formed on a partial region of the light emitting structure 10.

For example, the second electrode 17 may include one selected from the group consisting of Al, Ti, Cr, Ni, Pt, Au, W, Cu and Mo, or an alloy thereof, but the embodiment is not limited thereto.

When the second electrode 17 is locally formed on the partial region of the light emitting structure 10, a current is locally concentrated under or around the second electrode 17 due to power applied to the second electrode 17. Due to the current concentration, the light may not be uniformly emitted from an entire region of the light emitting structure 10.

In order to solve the problem, that is, the conductive layer 13 may be disposed corresponding to the entire region of the light emitting structure so as to spread the current supplied to the second electrode 17 to the entire region of the light emitting structure 100.

The conductive layer 13 may include a transparent conductive material. For example, the conductive layer 13 may include at least one selected from the group consisting of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au, and Ni/IrOx/Au/ITO.

Meanwhile, in order to prevent electrons of the active layer 7 from migrating to the second conductive semiconductor layer 9, an electron blocking layer 11 may be displayed between the active layer 7 and the second conductive semiconductor layer 9.

The mobility of electrons created from the first conductive semiconductor layer 5 is remarkably higher than the mobility of holes created from the second conductive semiconductor layer 9. The electrons are supplied to the active layer 7 so that the electrons may be used to emit light from the active layer 7.

However, some electrons of the active layer 7 do not stay at the active layer 7 but may migrate to the second conductive semiconductor layer 9. The electrons migrating to the second conductive semiconductor layer 9 are extinguished. If the number of the electrons migrating to the second conductive semiconductor layer 9 increases, the light emission efficiency may be degraded.

According to the embodiment, the electron blocking layer 11 is interposed between the active layer 7 and the second conductive semiconductor layer 9 to prevent the electrons of the active layer 7 from migrating to the second conductive layer 9 so that the light emission efficiency may be improved.

For instance, the electron blocking layer 11 may be formed of a semiconductor material having a composite formula of $In_xAl_yGa_{1-x-y}N$ ($0 \leq x \leq 1$, $0 \leq y \leq 1$, and $0 \leq x+y \leq 1$). The electron blocking layer 11 may include at least one of InAlGaN, GaN, AlGaN, InGaN, AlN, InN and AlInN, but the embodiment is not limited thereto.

The electron blocking layer 11 may have the energy band gap higher than the energy band gap of the active layer 7. The electron blocking layer 11 may have the thickness of about 100 Å to about 600 Å, but the embodiment is not limited thereto.

For example, the electron blocking layer 11 may include a superlattice structure having a periodicity of an $Al_zGa_{(1-z)}N$/GaN ($0 \leq z \leq 1$), but the embodiment is not limited thereto.

The electron blocking layer 11 allows the holes created from the second conductive semiconductor layer 9 to be easily injected into the active layer 7.

The electron blocking layer 11 may include P type dopants having Mg, Zn, Ca, Sr, and/or Ba, but the embodiment is not limited thereto.

The embodiment may expand the orientation angle to increase light power. In order to obtain the above technical effect, the embodiment may change the thickness or a refractive index of the active layer 7.

Figure 2:
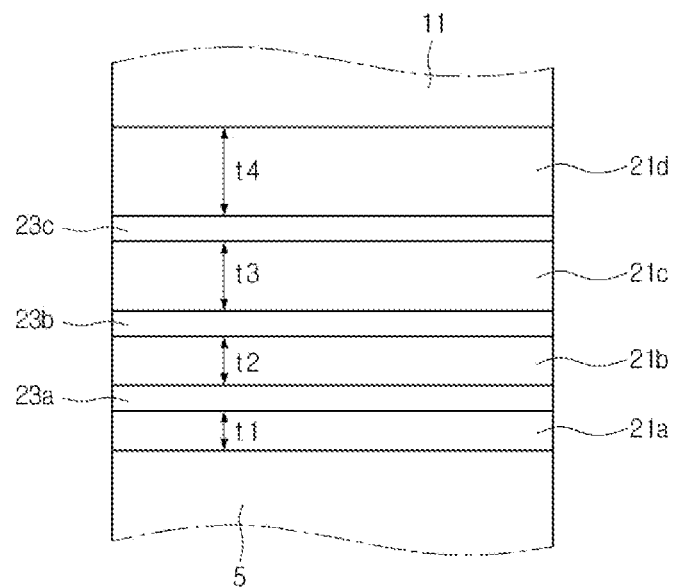
FIG. 2 is an enlarged sectional view illustrating a light emitting structure in the light emitting device of the FIG. 1.

As shown in FIG. 2, the active layer 7 may include a plurality of barrier layers 21a, 21b, 21c, and 21d and a plurality of well layers 23a, 23b, and 23c.

The well layers 23a, 23b, and 23c may be disposed between the barrier layers 21a, 21b, 21c, and 21d.

For example, a first barrier layer 21a may be disposed adjacent to the first conductive semiconductor layer 5, and a first well layer 23a may be disposed adjacent to the first barrier layer 21a. A second barrier layer 21b may be disposed adjacent to the first well layer 23a, and a second well layer 23b may be disposed adjacent to the second barrier layer 21b.

A third barrier layer 21c may be disposed adjacent to the second well layer 23b, and a third well layer 23c may be disposed adjacent to the third barrier layer 21c. A fourth barrier layer 21d may make be disposed adjacent to the third well layer 23c, and the second conductive semiconductor layer 9 may be disposed adjacent to the fourth barrier layer 21d.

The first to third well layers 23a, 23b, and 23c may have the same thickness or have different thicknesses, but the embodiment is not limited thereto.

At least two of the first to fourth barrier layers 21a, 21b, 21c, and 21d may have different thicknesses t1, t2, t3, and t4.

The thicknesses t1, t2, t3, and t4 of the first to fourth barrier layers 21a, 21b, 21c, 21d may increase toward the second conductive semiconductor layer 9 from the first conductive semiconductor layer 5. The thicknesses t1, t2, t3, and t4 of the first to fourth barrier layers 21a, 21b, 21c, 21d may linearly or non-linearly increase.

For example, the second barrier layer 21b may have a thickness t2 greater than a thickness t1 of the first barrier layer 21a, the third barrier layer 21c may have a thickness t3 greater than the thickness t2 of the second barrier layer 21a, and the fourth barrier layer 21d may have a thickness t4 greater than the thickness t3 of the third barrier layer 21c.

In this manner, the bending of an energy band due to the lattice constant difference between the well layers 23a, 23b, and 23c and the barrier layers 21a, 21b, 21c, and 21d can be prevented by increasing the thicknesses t1, t2, t3, and t4 of the first to fourth barrier layers 21a, 21b, 21c, and 21d so that light power may increase.

Some of the first to fourth barrier layers 21a, 21b, 21c, and 21d may have the same thickness, but the embodiment is not limited thereto.

When the thickness of the barrier layer is thin, an energy band of the barrier layer may be bent due to a lattice constant difference between the barrier layer and the well layer.

Accordingly, by increasing the thicknesses t1, t2, t3, and t4 of the barrier layers 21a, 21b, 21c, 21d from the barrier layer 21a adjacent to the first conductive semiconductor layer 5 to the barrier layer 21d adjacent to the second conductive semiconductor layer 9, even if the lattice constant difference occurs between the barrier layers 21a, 21b, 21c, 21d and the well layers 23a, 23b, and 23c, energy bands of the barrier layers 21a, 21b, 21c, 21d are not bent. Accordingly, separation of electrons or holes filled in the well layers 23a, 23b, and 23c can be prevented so that the light power may increase.

An increase rate in thicknesses between the first to fourth barrier layers 21a, 21b, 21c, and 21d may be in the range of about 2% to about 10%, but the embodiment is not limited thereto.

For example, when the increase rate in thicknesses between the first to fourth barrier layers 21a, 21b, 21c, and 21d exceeds 10%, the thicknesses of the third and fourth barrier layers 21c and 21d are so thick that the electrons of the holes may not pass through the barrier layers 21c and 21d. Accordingly, the electrons or the holes are rarely filled in the well layers 23b and 23c so that the light power may be lowered. If the increase rate in the thickness is less than 2%, it may not be clearly recognized.

An energy band diagram of the active layer 7 according to the embodiment may be variously deformed.

Figure 3:
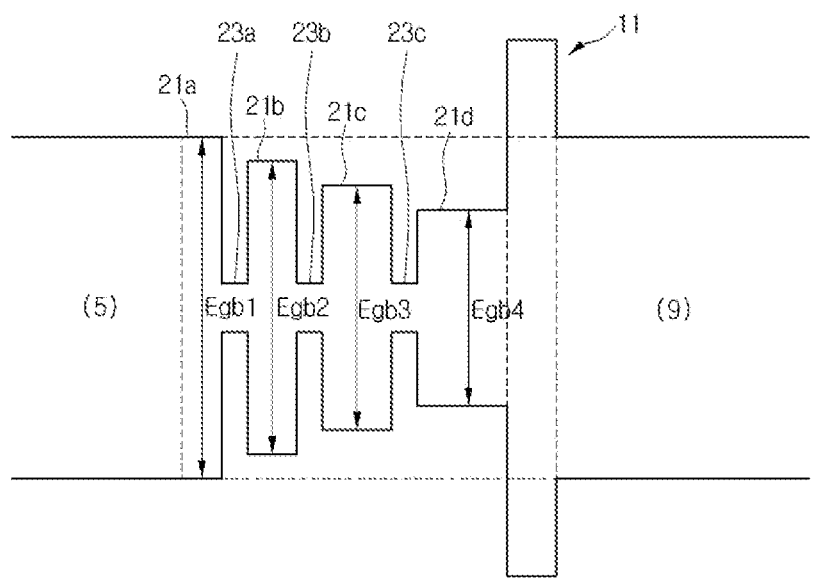
FIG. 3 is a view showing an energy band diagram of a light emitting structure according to a first embodiment.

FIG. 3 is a view showing an energy band diagram of a light emitting structure according to a first embodiment.

As shown in FIG. 3, the first to third well layers 23a, 23b, and 23c may have the same energy bandgap. Accordingly, the light emitting device of the embodiment may emit light having a main wavelength band corresponding to the energy bandgaps of the first to third well layers 23a, 23b, and 23c. For example, the light emitting device of the embodiment may emit light having the main wavelength band in the range of about 380 nm to about 480 nm, but the embodiment is not limited thereto.

At least two of the first to fourth barrier layers 21a, 21b, 21c, and 21d may have different energy bandgaps Egb1, Egb2, Egb3, and Egb4.

The energy bandgaps Egb1, Egb2, Egb3, and Egb4 of the first to fourth barrier layers 21a, 21b, 21c, and 21d may be reduced toward the second conductive semiconductor layer 9 from the first conductive semiconductor layer 5. The energy bandgaps Egb1, Egb2, Egb3, and Egb4 of the first to fourth barrier layers 21a, 21b, 21c, and 21d may be linearly or non-linearly reduced.

For example, the second barrier layer 21b may have an energy bandgap Egb2 less than an energy bandgap Egb1 of the first barrier layer 21a, the third barrier layer 21c may have an energy bandgap Egb3 less than the energy bandgap Egb2 of the second barrier layer 21b, and the fourth barrier layer 21d may have an energy bandgap Egb4 less than the energy bandgap Egb3 of the third barrier layer 21c, but the embodiment is not limited.

A reduction rate in an energy bandgap between the first to fourth barrier layers 21a, 21b, 21c, and 21d may be in the range of about 5% to about 30%, but the embodiment is not limited thereto.

The second to fourth barrier layers 21b, 21c, and 21d may have energy bandgaps Egb2, Egb3, and Egb4 greater than an energy bandgap of the first conductive semiconductor layer 5 or the second conductive semiconductor layer 9, and the first barrier layer 21a may have an energy bandgap Egb1 equal to an energy bandgap of the first conductive semiconductor layer 5 or the second conductive semiconductor layer 9, but the embodiment is not limited thereto.

The energy bandgaps Egb1, Egb2, Egb3, and Egb4 of the first to fourth barrier layers 21a, 21b, 21c, and 21d may be adjusted by controlling the indium content.

If the indium content increases, the energy bandgap may be reduced but a refractive index may increase.

Accordingly, when the energy bandgaps Egb1, Egb2, Egb3, and Egb4 of the first to fourth barrier layers 21a, 21b, 21c, and 21d are linearly or non-linearly reduced from the first conductive semiconductor layer 5 to the second conductive semiconductor layer 9, the indium content may linearly or non-linearly increase.

For example, the second barrier layer 21b may have an indium content more than the indium content of the first barrier layer 21a, the third barrier layer 21c may have an indium content more than the indium content of the second barrier layer 21b, and the fourth barrier layer 21d may have an indium content more than the indium content of the third barrier layer 21d, but the embodiment is not limited thereto.

The first barrier layer 21a may include the indium content of 0 or the indium content less than the indium content of the second barrier layer 21b, but the embodiment is not limited thereto. The first barrier layer 21a may include GaN or InGaN, and the second to fourth barrier layers 21b, 21c, and 21d may include InGaN, but the embodiment is not limited thereto.

The first to fourth barrier layers 21a, 21b, 21c, and 21d may have the indium content less than the indium content of at least the well layers 23a, 23b, and 23c, but the embodiment is limited thereto.

Figure 4:
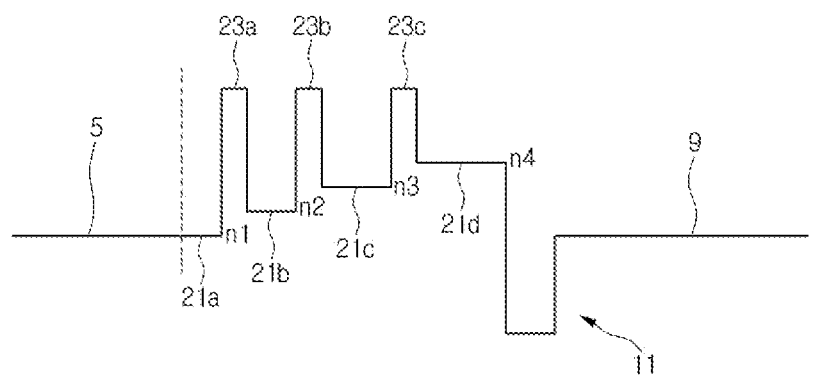
FIG. 4 is a sectional view showing a refractive index diagram according to a first embodiment FIG. 3.

A refractive index diagram with respect to the energy band diagram as illustrated in FIG. 3 is illustrated in FIG. 4.

As shown in FIG. 4, the first to third well layers 23a, 23b, and 23c may have the same refractive index.

To the contrary, at least two of the first to fourth barrier layers 21a, 21b, 21c, and 21d may have different refractive indexes.

For example, the refractive indexes n1, n2, n3, and n4 of the first to fourth barrier layers 21a, 21b, 21c, and 21d may inearly or non-linearly increase toward the second conductive semiconductor layer 9 from the first conductive semiconductor layer 5. For example, the second barrier layer 21b may have a refractive index n2 greater than a refractive index n1 of the first barrier layer 21a, the third barrier layer 21c may have a refractive index n3 greater than the refractive index n2 of the second barrier layer 21b, and the fourth barrier layer 21d may have a refractive index n4 greater than the refractive index n3 of the third barrier layer 21c.

An increase rate in refractive indexes between the first to fourth barrier layers 21a, 21b, 21c, and 21d may be in the range of about 5% to about 15%, but the embodiment is not limited thereto.

According to the first embodiment, the first to third well layers 23a, 23b, and 23c have the same refractive index, whereas the first to fourth barrier layers 21a, 21b, 21c, and 21d may have refractive indexes n1, n2, n3, and n4 which linearly or non-linearly increase. Accordingly, the difference in the refractive indexes between the well layers 23a, 23b, and 23c and the barrier layers 21a, 21b, 21c, and 21d may gradually decrease toward the second conductive semiconductor layer 9 from the first conductive semiconductor layer 5 so that light emission may increase, thereby increasing light power. Further, since the light is spread, an orientation angle can increase.

That is, as the difference in refractive indexes between a plurality of barrier layers 21a, 21b, 21c, and 21d and a plurality of well layers 23a, 23b, and 23c in the active layer 7 decreases, light generated from the active layer 7 and directed toward the second conductive semiconductor layer 9 may be more easily emitted to the outside with a greater orientation angle.

As the difference in refractive indexes between the barrier layers 21a, 21b, 21c, and 21d and the well layers 23a, 23b, and 23c increases, light generated from the active layer 7 and directed toward the first conductive semiconductor layer 5 is not directed toward the first conductive semiconductor layer 5 but is directed into the active layer 7 due to the total reflection, and the light may be emitted to the outside through the second conductive semiconductor layer 9. Although not shown in the drawing, the light generated from the active layer 7 and directed toward the first conductive semiconductor layer 5 is scattered or reflected by a light extraction structure that includes a concavo-convex and is formed on a top surface of the substrate 1, so that the scattered or reflected light may be emitted to the outside.

Figure 5:
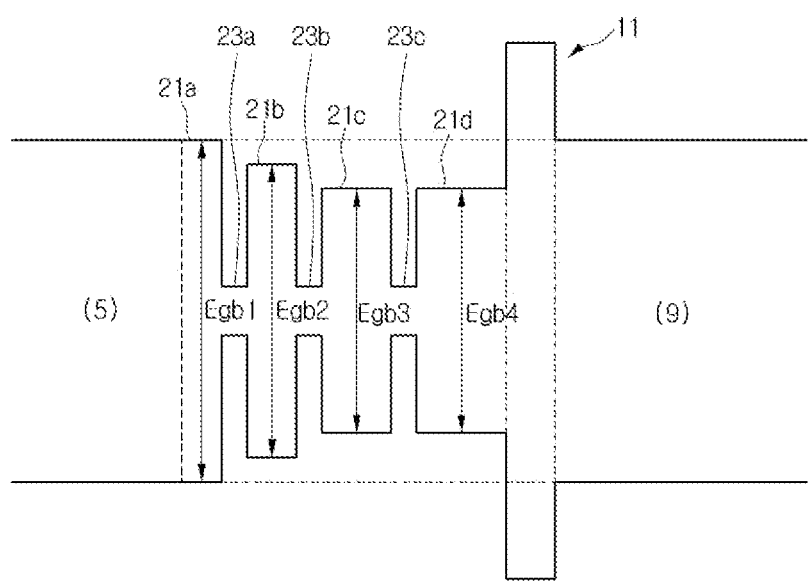
FIG. 5 is a view showing an energy band diagram of a light emitting structure according to a second embodiment.

FIG. 5 is a view showing an energy band diagram of a light emitting structure according to a second embodiment.

As shown in FIG. 5, the first to third well layers 23a, 23b, and 23c have the same energy bandgap, whereas at least two of the first to fourth barrier layers 21a, 21b, 21c, and 21d may have different energy bandgaps Egb1, Egb2, Egb3, and Egb4.

The energy bandgaps Egb1, Egb2, and Egb3 of the first to third barrier layers 21a, 21b, and 21c may be reduced toward the second conductive semiconductor layer 9 from the first conductive semiconductor layer 5. The fourth barrier layer 21d may have the energy bandgap Egb4 equal to the energy bandgap Egb3 of the third barrier layer 21c. The energy bandgaps Egb1, Egb2, and Egb3 of the first to third barrier layers 21a, 21b, and 21c may be linearly or non-linearly reduced.

For example, the second barrier layer 21b may have an energy bandgap Egb2 less than an energy bandgap Egb1 of the first barrier layer 21a, and the third barrier layer 21c may have an energy bandgap Egb3 less than the energy bandgap Egb2 of the second barrier layer 21b, but the embodiment is not limited.

A reduction rate in an energy bandgap between the first to third barrier layers 21a, 21b, and 21c may be in the range of about 5% to about 30%, but the embodiment is not limited thereto.

The second and third barrier layers 21b and 21c may have energy bandgaps Egb2 and Egb3 less than an energy bandgap of the first conductive semiconductor layer 5 or the second conductive semiconductor layer 9, and the first barrier layer 21a may have an energy bandgap Egb1 equal to an energy bandgap of the first conductive semiconductor layer 5 or the second conductive semiconductor layer 9, but the embodiment is not limited thereto.

Figure 6:
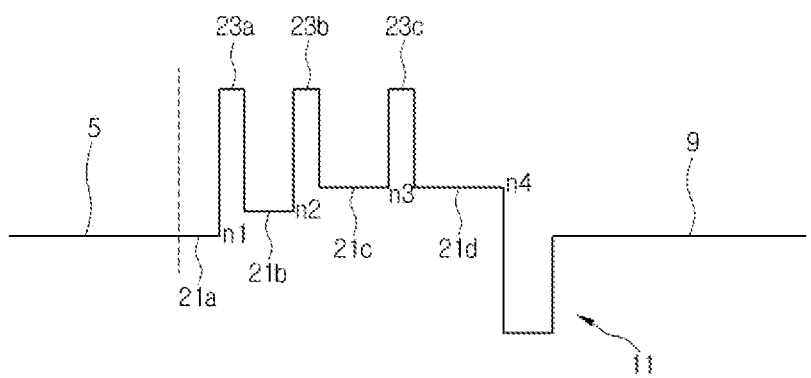
FIG. 6 is a sectional view showing a refractive index diagram according to a second embodiment FIG. 5.

A refractive index diagram with respect to the energy band diagram as illustrated in FIG. 5 is illustrated in FIG. 6.

As shown in FIG. 6, the first to third well layers 23a, 23b, and 23c may have the same refractive index.

To the contrary, at least two of the first to fourth barrier layers 21a, 21b, 21c, and 21d may have different refractive indexes.

The refractive indexes n1, n2, and n3 of the first to third barrier layers 21a, 21b, and 21c may inearly or non-linearly increase toward the second conductive semiconductor layer 9 from the first conductive semiconductor layer 5, and the fourth barrier layer 21d may have a refractive index n4 equal to the refractive index n3 of the third barrier 21c. For example, the second barrier layer 21b may have a refractive index n2 greater than a refractive index n1 of the first barrier layer 21a, and the third barrier layer 21c may have a refractive index n3 greater than the refractive index n2 of the second barrier layer 21b.

An increase rate in refractive indexes between the first to third barrier layers 21a, 21b, and 21c may be in the range of about 5% to about 15%, but the embodiment is not limited thereto.

According to the second embodiment, the first to third well layers 23a, 23b, and 23c have the same refractive index, whereas the first to third barrier layers 21a, 21b, and 21c may have refractive indexes n1, n2, n3, and n4 which linearly or non-linearly increase, and the fourth barrier layer 21d may have a refractive index n4 equal to the refractive index n3 of the third barrier layer 21c. Accordingly, the difference in the refractive indexes between the well layers 23a, 23b, and 23c and the barrier layers 21a, 21b, 21c, and 21d may decrease toward the second conductive semiconductor layer 9 from the first conductive semiconductor layer 5 so that light emission may increase, thereby increasing light power. Further the light is spread, an orientation angle can increase.

Figure 7:
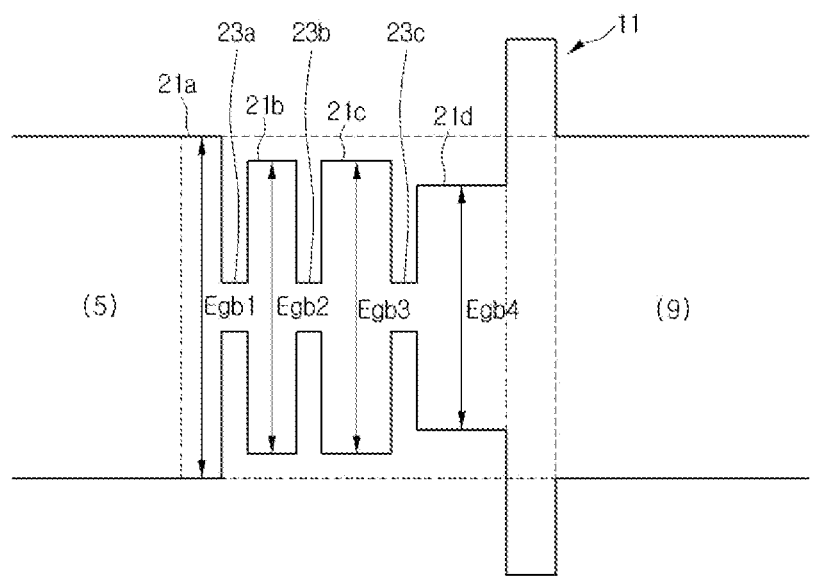
FIG. 7 is a view showing an energy band diagram of a light emitting structure according to a third embodiment.

FIG. 7 is a view showing an energy band diagram of a light emitting structure according to a third embodiment.

As shown in FIG. 7, the first to third well layers 23a, 23b, and 23c have the same energy bandgap, whereas at least two of the first to fourth barrier layers 21a, 21b, 21c, and 21d may have different energy bandgaps Egb1, Egb2, Egb3, and Egb4.

The energy bandgaps Egb1, Egb2, and Egb4 of the first, second, and fourth barrier layers 21a, 21b, and 21d may be reduced toward the second conductive semiconductor layer 9 from the first conductive semiconductor layer 5. The third barrier layer 21c may have the energy bandgap Egb3 equal to the energy bandgap Egb2 of the second barrier layer 21b. The energy bandgaps Egb1, Egb2, and Egb4 of the first, second, and fourth barrier layers 21a, 21b, and 21d may be linearly or non-linearly reduced.

For example, the second barrier layer 21b may have an energy bandgap Egb2 less than an energy bandgap Egb1 of the first barrier layer 21a, and the fourth barrier layer 21d may have an energy bandgap Egb4 less than the energy bandgap Egb2 of the second barrier layer 21b, but the embodiment is not limited.

A reduction rate in an energy bandgap between the first, second, and fourth barrier layers 21a, 21b, and 21d may be in the range of about 5% to about 30%, but the embodiment is not limited thereto.

The second to fourth barrier layers 21b, 21c, and 21d may have energy bandgaps Egb2, Egb3, and Egb4 less than an energy bandgap of the first conductive semiconductor layer 5 or the second conductive semiconductor layer 9, and the first barrier layer 21a may have an energy bandgap Egb1 equal to an energy bandgap of the first conductive semiconductor layer 5 or the second conductive semiconductor layer 9, but the embodiment is not limited thereto.

Figure 8:
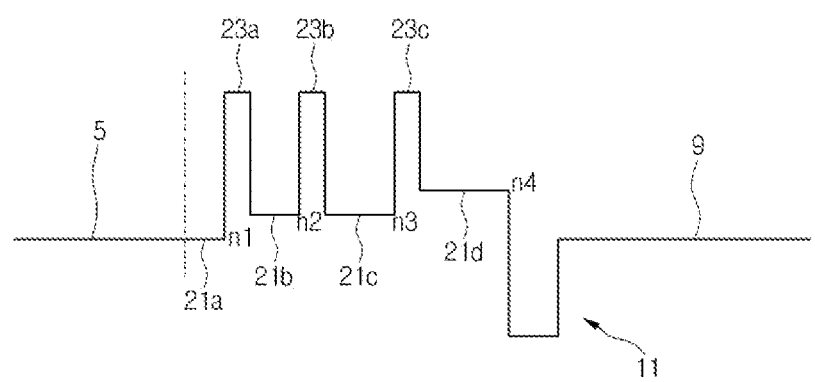
FIG. 8 is a sectional view showing a refractive index diagram according to a first embodiment of FIG. 7.

A refractive index diagram with respect to the energy band diagram as illustrated in FIG. 7 is illustrated in FIG. 8.

As shown in FIG. 8, the first to third well layers 23a, 23b, and 23c may have the same refractive index.

To the contrary, at least two of the first to fourth barrier layers 21a, 21b, 21c, and 21d may have different refractive indexes.

The refractive indexes n1, n2, and n4 of the first, second, and fourth barrier layers 21a, 21b, and 21d may inearly or non-linearly increase toward the second conductive semiconductor layer 9 from the first conductive semiconductor layer 5, and the third barrier layer 21c may have a refractive index n3 equal to the refractive index n2 of the third barrier 21b. For example, the second barrier layer 21b may have a refractive index n2 greater than a refractive index n1 of the first barrier layer 21a, and the fourth barrier layer 21d may have a refractive index n4 greater than the refractive index n2 of the second barrier layer 21b.

An increase rate in refractive indexes between the first, second, and fourth barrier layers 21a, 21b, and 21d may be in the range of about 5% to about 15%, but the embodiment is not limited thereto.

According to the third embodiment, the first to third well layers 23a, 23b, and 23c have the same refractive index, whereas the first, second, and fourth barrier layers 21a, 21b, and 21d may have refractive indexes n1, n2, and n4 which linearly or non-linearly increase, and the third barrier layer 21c may have a refractive index n3 equal to the refractive index n2 of the second barrier layer 21b. Accordingly, the difference in the refractive indexes between the well layers 23a, 23b, and 23c and the barrier layers 21a, 21b, 21c, and 21d may decrease toward the second conductive semiconductor layer 9 from the first conductive semiconductor layer 5 so that light emission may increase, thereby increasing light power. Further, since the light is spread, an orientation angle can increase.

Figure 9:
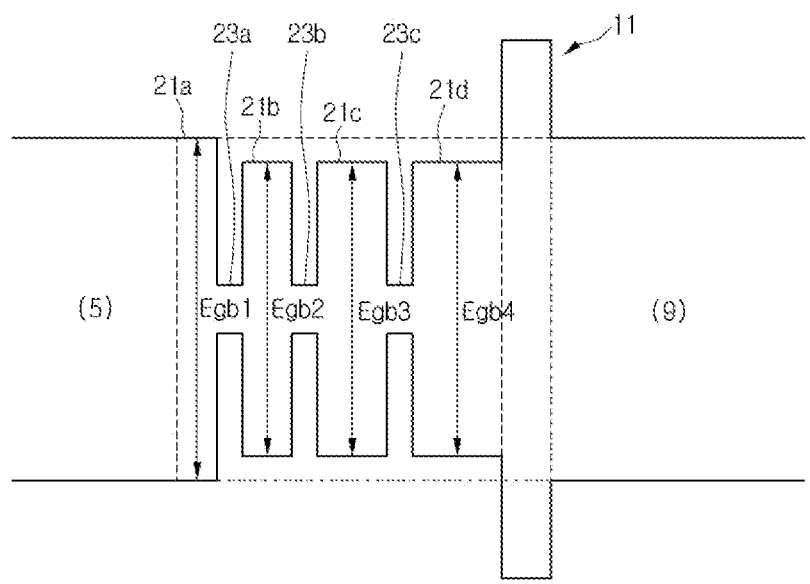
FIG. 9 is a view showing an energy band diagram of a light emitting structure according to a fourth embodiment.

FIG. 9 is a view showing an energy band diagram of a light emitting structure according to a fourth embodiment.

As shown in FIG. 9, the first to third well layers 23a, 23b, and 23c have the same energy bandgap, whereas at least two of the first to fourth barrier layers 21a, 21b, 21c, and 21d may have different energy bandgaps Egb1, Egb2, Egb3, and Egb4.

The second barrier layer 21b may have an energy bandgap Egb2 less than an energy bandgap Egb1 of the first barrier layer 21a, and the third and fourth barrier layer 21c and 21d may have energy bandgaps Egb3 and Egb4 equal to the energy bandgap Egb2 of the second barrier layer 21b.

A reduction rate in an energy bandgap between the first and second barrier layers 21a and 21b may be in the range of about 5% to about 30%, but the embodiment is not limited thereto.

The second to fourth barrier layers 21b, 21c, and 21d may have energy bandgaps Egb2, Egb3, and Egb4 less than an energy bandgap of the first conductive semiconductor layer 5 or the second conductive semiconductor layer 9, and the first barrier layer 21a may have an energy bandgap Egb1 equal to an energy bandgap of the first conductive semiconductor layer 5 or the second conductive semiconductor layer 9, but the embodiment is not limited thereto.

Figure 10:
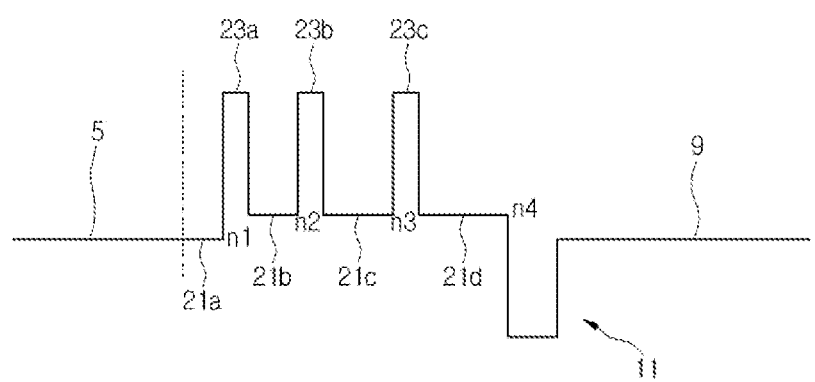
FIG. 10 is a sectional view showing a refractive index diagram according to a fourth embodiment of FIG. 9.

A refractive index diagram with respect to the energy band diagram as illustrated in FIG. 9 is illustrated in FIG. 10.

As shown in FIG. 10, the first to third well layers 23a, 23b, and 23c may have the same refractive index.

To the contrary, at least two of the first to fourth barrier layers 21a, 21b, 21c, and 21d may have different refractive indexes.

The second barrier layer 21b may have a refractive index n2 greater than the refractive index n1 of the first barrier layer 21a, and the third and fourth barrier layer 21c and 21d may have refractive indexes n3 and n4 equal to the refractive index n2 of the second barrier layer 21b.

An increase rate in refractive indexes between the first and second barrier layers 21a and 21b may be in the range of about 5% to about 15%, but the embodiment is not limited thereto.

According to the fourth embodiment, the first to third well layers 23a, 23b, and 23c have the same refractive index, whereas the second barrier layer 21b may have a refractive index n2 equal to the refractive index n1 of the first barrier layer 21a, and the third and fourth barrier layers 21c and 21d may have refractive indexes n3 and n4 equal to the refractive index n2 of the second barrier layer 21b. Accordingly, the difference in the refractive indexes between the well layers 23a, 23b, and 23c and the barrier layers 21a, 21b, 21c, and 21d may decrease toward the second conductive semiconductor layer 9 from the first conductive semiconductor layer 5 so that light emission may increase, thereby increasing light power. Further, since the light is spread, an orientation angle can increase.

Figure 11:
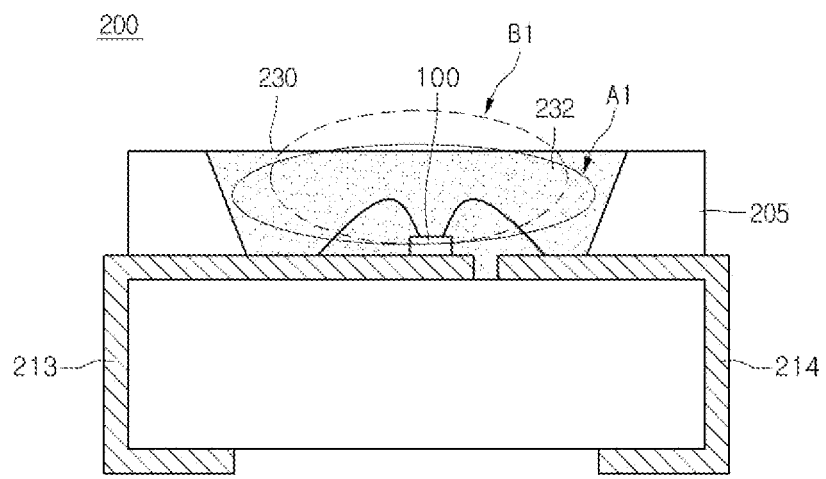
FIG. 11 is a sectional view illustrating a light emitting device package according to the embodiment.

FIG. 11 is a sectional view illustrating a light emitting device package according to the embodiment.

Referring to FIG. 11, the emitting device package according to the embodiment includes a body 205, first and second lead frames 213 and 214 installed in the body 205, a light emitting device receiving power from the first and second lead frames 213 and 214, and a molding member 230 surrounding the light emitting device 100.

The body 205 may include silicon, synthetic resin, or metal, and inclined surfaces may be formed around the light emitting device 100.

The first and second lead frames 213 and 214 are electrically insulated from each other, and supply power to the light emitting device 100.

The first and second lead frames 213 and 214 may reflect light generated from the light emitting device 100 to increase light efficiency, and may discharge heat emitted from the light emitting device 100 to the outside.

The light emitting device 100 may be installed in one of the first lead frame 213, the second lead frame 214, and the body 205, and may be electrically connected to the first and second lead frames 213 and 214 through a wire scheme, or a die bonding scheme, but the embodiment is not limited thereto.

For example, the light emitting device 100 may be electrically connected to the first and second lead frames 213 and 214 through wires, but the embodiment is not limited thereto.

A lateral type light emitting device of FIG. 1 is applicable as the light emitting device 100, but the embodiment is not limited thereto. That is, a flip type light emitting device or a vertical type light emitting device is applicable.

The molding member 230 may surround the light emitting device 100 to protect the light emitting device 100. The molding member 230 may include a phosphor 232 that may change the wavelength of the light generated from the light emitting device 100.

The light emitting device package 200 according to the embodiment includes a Chip On Board (COB) light emitting device package, and the body 205 has a flat top surface. The body 205 may be provided thereon with a plurality of light emitting devices 100.

A plurality of light emitting device packages 200 according to the embodiment may be arrayed on the substrate. In addition, optical members, such as a light guide plate, a prism sheet, a diffusion sheet, and a fluorescence sheet may be installed on the path of a light emitted from the light emitting device package. The light emitting device package 200, the substrate and the optical members may serve as a backlight unit or a lighting unit. For example, a lighting system may include a backlight unit, a lighting unit, an indicator, a lamp, or a street lamp.

According to the related art, in order to improve light efficiency of a white LED used as a display or a lighting source, the light power increases by improving a structure of an active layer in a case of an LED chip or by increasing light extraction efficiency using a PSS substrate. Internal quantum efficiency (IQE) of a TV BLU or lighting system, which is currently used in real life, has a value in the range of about 75% to about 85%. Accordingly, the possibility of increasing light power by improving a structure or a manufacturing process of a chip is low.

In a case of a white package, the phosphors 232 are uniformly distributed outside the light emitting device 100. In this case, for example, the light emitting device 100 emits light having a main wavelength band in the range of 380 nm to 480 nm, and the phosphor 232 may convert light having the main wavelength band in the range of 380 nm to 480 nm into light having the main wavelength band in the range of 560 nm to 590 nm. The light having the main wavelength band in the range of 380 nm to 480 nm emitted from the light emitting device 100 is mixed with light having the main wavelength band in the range of 60 nm to 590 nm to generate white light. Only when the light emitted from the light emitting device 100 is widely spread, the whole phosphors 232 are uniformly excited so that the light is emitted, thereby increasing a luminous flux of the package. To the contrary, when the light emitted from the light emitting device 100 is narrowly spread, only some of the phosphors 32 are excited so that the light is emitted, thereby decreasing the luminous flux of the package.

According to the embodiment, different from a scheme of increasing light power of a white package by increasing light power of a chip, light power of the white package increases by controlling distribution of light emitted from a device.

For example, the embodiment can widely emit light by adjusting a composition of respective layers constituting the light emitting device rather than adjusting light power of the light emitting device.

In detail, a light distribution property due to the difference in a refractive index varies by varying the thickness of the barrier layer included in the active layer of the light emitting device and a composition of the barrier layer.

According to the embodiment, light power of the white package can be improved by changing the orientation angle A1 as compared with an orientation angle B1 according to the relate art.

Figure 12:
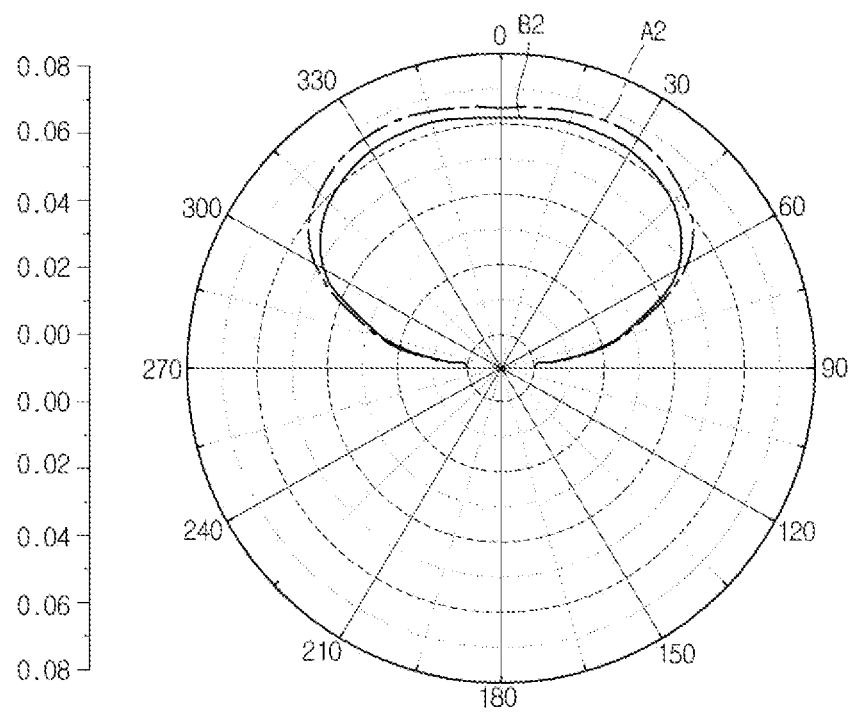
FIG. 12 is a graph showing an example of light distribution of the light emitting device package according to the embodiment.

FIG. 12 is a graph showing an example of light distribution of the light emitting device package according to the embodiment.

For example, according to the embodiment, a refractive index is controlled by changing a thickness or a composition of the barrier layer included in the active layer so that distribution of the light emitted to the outside can be controlled.

TABLE 1

| | Orientation angle (°) | Light power of white package (lm) |
|---|---|---|
| Embodiment | 140.06 | 105.8% |
| Related art | 137.40 | 100.0% |

Table 1 illustrates an orientation angle and light power data of a white package.

According to the embodiment, as compared with light distribution B2 according to the related art, light distribution A2 according to the embodiment becomes wider under the control of a refractive index of the active layer, so the orientation angle increases by about 2.66° from 137.40° to 140.06° so that light power of a white LED package is substantially increased by about 5.8%.

The embodiment can increase light power by increasing the orientation angle of the light emitting device package.

The embodiment can improve the orientation angle of the light by adjusting the thickness of the barrier layer included in the active layer, the energy bandgap, the indium content, and the refractive index, thereby increasing light power.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such a feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a substrate;
a first conductive semiconductor layer on the substrate;
an active layer on the first conductive semiconductor layer; and
a second conductive semiconductor layer on the active layer,
wherein the active layer comprises:
a plurality of barrier layers; and
a plurality of well layers between the barrier layers,
wherein at least two of the barrier layers have different energy bandgaps and different thicknesses, and
wherein differences in refractive indexes between the well layers and the barrier layers gradually decrease toward the second conductive semiconductor layer from the first conductive semiconductor layer, and
wherein the active layer comprises a first barrier layer most adjacent to the second semiconductor layer and a second barrier layer most adjacent to the first barrier layer have the same energy bandgaps and refractive index.

2. The light emitting device of claim 1, wherein the thicknesses of the plurality of barrier layers linearly vary.

3. The light emitting device of claim 1, wherein the thicknesses of the plurality of barrier layers non-linearly vary.

4. The light emitting device of claim 1, wherein the thicknesses of the barrier layers increase toward the second conductive semiconductor layer from the first conductive semiconductor layer.

5. The light emitting device of claim 1, wherein the energy bandgaps of the barrier layers linearly vary.

6. The light emitting device of claim 1, wherein the energy bandgaps of the barrier layers non-linearly vary.

7. The light emitting device of claim 1, wherein the energy bandgaps of the barrier layers are reduced toward the second conductive semiconductor layer from the first conductive semiconductor layer.

8. The light emitting device of claim 1, wherein at least two of barrier layers have the same thickness.

9. The light emitting device of claim 1, wherein at least two of barrier layers have the same energy bandgap.

10. The light emitting device of claim 1, wherein a first barrier layer adjacent to the first conductive semiconductor layer comprises one of GaN and InGaN.

11. The light emitting device of claim 10, wherein the remaining barrier layers except for the first barrier layer comprise InGaN.

12. The light emitting device of claim 1, wherein an increase rate in the thicknesses between the barrier layers is in a range of about 2% to about 10%.

13. The light emitting device of claim 1, wherein a reduction rate in the energy bandgaps between the barrier layers is in a range of about 5% to about 30%.

14. The light emitting device of claim 1, wherein at least two of the barrier layers have different refractive indexes.

15. The light emitting device of claim 1, wherein an increase rate in refractive indexes between the barrier layers is in a range of about 5 to about 15%.

16. A light emitting device comprising:
a substrate;
a first conductive semiconductor layer on the substrate;
an active layer on the first conductor semiconductor layer; and
a second conductive semiconductor layer on the active layer,
wherein the active layer comprises:
a plurality of barrier layers; and
a plurality of well layers between the barrier layers, and
wherein a lowermost layer of the barrier layers is adjacent to the first conductive semiconductor layer,
an uppermost layer of the barrier layers is adjacent to the second conductive semiconductor layer,
an energy bandgap of the lowermost layer is greater than an energy bandgap of the uppermost layer, and
a thickness of the lowermost layer is less than a thickness of the uppermost layer,
wherein differences in refractive indexes between the well layers and the barrier layers gradually decrease toward the second conductive semiconductor layer from the first conductive semiconductor layer and
wherein the active layer comprises a first barrier layer most adjacent to the second semiconductor layer and a second barrier layer most adjacent to the first barrier layer have the same energy bandgap and refractive index.

17. The light emitting device of claim 16, wherein at least one barrier layer is disposed between the uppermost layer and the lowermost layer, and
indium contents of the at least one barrier layer are different from each other.

18. A light emitting device package comprising:
a body;
first and second lead frames on the body; and
a light emitting device on the body or on at least one of the first and second lead frames,
wherein the light emitting device comprises:
a substrate;
a first conductive semiconductor layer on the substrate;
an active layer on the first conductive semiconductor layer; and
a second conductive semiconductor layer on the active layer,
wherein the active layer comprises:
a plurality of barrier layers; and
a plurality of well layers between the barrier layers,
wherein at least two of the barriers have different energy bandgaps and different thicknesses, and wherein the differences in refractive indexes between the well layers and the barrier layers gradually decrease toward the second conductive semiconductor layer from the first conductive semiconductor layer, and wherein the active layer comprises a first barrier layer most adjacent to the second semiconductor layer and a second barrier layer most adjacent to the first barrier layer have the same energy bandgap and refractive index.

19. The light emitting device of claim 1, wherein there is only one well layer disposed between the first barrier layer and the second barrier layer of the active layer.

20. The light emitting device of claim 1, further comprising a third barrier layer disposed between the first conductive semiconductor layer and the second barrier layer, wherein a thickness of the second barrier layer is greater than a thickness of the third barrier layer.

* * * * *